June 17, 1969 FUMIO KUBOTA 3,450,965

SEMICONDUCTOR HAVING REINFORCED LEAD STRUCTURE

Filed May 26, 1967

INVENTOR.
Fumio Kubota

BY Hill, Sherman, Meroni, Gross & Simpson ATTORNEYS

United States Patent Office 3,450,965
Patented June 17, 1969

3,450,965
SEMICONDUCTOR HAVING REINFORCED LEAD STRUCTURE

Fumio Kubota, Machida-shi, Tokyo, Japan, assignor to Sony Corporation, Tokyo, Japan, a corporation of Japan Filed May 26, 1967, Ser. No. 641,604
Claims priority, application Japan, May 28, 1966, 41/49,671
Int. Cl. H01l 5/00
U.S. Cl. 317—235 8 Claims

ABSTRACT OF THE DISCLOSURE

A planar transistor having a silicon substrate layer and a silicon oxide layer disposed at one surface of the substrate and having a pair of principal electrodes electrically connected to oppositely conductive portions of the substrate layer. A plurality of island electrodes are formed on the passivated silicon oxide layer in the vicinity of the principal electrodes and a lead wire is bonded to the principal electrodes and to a portion of the further island electrodes such that a minimum capacitive effect is achieved at high frequency operation of the transistor.

*Description of the prior art*

Prior high frequency transistors are provided with principal electrodes having minimal dimensions in order to reduce the effective capacitance between the electrodes and the substrate layers of the transistor. However, when the area of the principal electrodes is reduced to reduce the effective stray capacitance, the bond between the lead wires and the electrodes is also reduced thereby weakening the mechanical connection between the lead wire and the electrode. Accordingly, prior art high frequency transistors have been provided with electrodes which are a compromise between the desired low stray capacitance and the required high bonding strength between the electrodes and the external lead wires.

BACKGROUND OF THE INVENTION

*Field of the invention*

The field of art to which this invention pertains is a semiconductor device and principally a semiconductor device which is operated at high frequencies wherein the effective stray capacitance between the electrodes and the substrate layers and other portions of the transistor are of critical significance to the effective employment of the semiconductor device.

*Summary*

An important feature of the present invention is the provision of a semiconductor device having a number of electrodes for being attached to external lead wires wherein a maximum bonding strength is provided between the electrodes and the lead wires while assuring a minimum stray capacitance between the electrodes and the semiconductor layers even at high operating frequencies.

It is another feature of the present invention to provide a semiconductor device having a high bonding strength and a low stray capitance even at high operating frequencies and which device is readily and economically constructed and which is easily adaptable to mass production operations.

It is an important object of the present invention to provide a semiconductor device having at least one PN junction and at least one principal electrode electrically connected to each conductive layer forming the PN junction and wherein a plurality of further electrodes are provided to be electrically isolated from the principal electrodes thereby increasing the effective bonding area of a lead wire while minimizing high frequency capacitive effects between the electrodes and the conductive layers of the transistor.

It is another object of this invention to provide a semiconductor device having at least one PN junction and having a principal electrode electrically connected to each of the conductive layers forming the junction wherein a plurality of island electrodes are formed adjacent the extremity of the principal electrodes thereby expanding the effective contact area of a lead wire and wherein the island electrodes are electrically insulated from the substrate layers of the semiconductor device as well as from the principal electrodes.

It is also an object of this invention to provide a semiconductor device of the type described above wherein the island electrodes are disposed on a passivated layer at the surface of the semiconductor device along a width which is substantially greater than the width of the principal electrode and having an effective area which is substantially greater than the effective area of the region of contact between the lead wire and the island electrodes.

It is an additional object of this invention to provide a semiconductor device of the type described above wherein the plurality of island electrodes are spaced from one another and disposed along a generally planar surface of the transistor adjacent to an extremity of a principal electrode such that a lead wire may be caused to overlie the principal electrode and a portion of the plurality of island electrodes such that the effective bonding area between the lead wire and the electrodes is increased while the effective stray capacitance between the lead wire and the electrodes and the semiconductor substrate layers is minimized.

These and other objects, features and advantages of the present invention will be understood in greater detail from the following description of the associated drawing wherein reference numerals are utilized in designating a preferred embodiment.

*Decription of the preferred embodiment*

Figure 1:
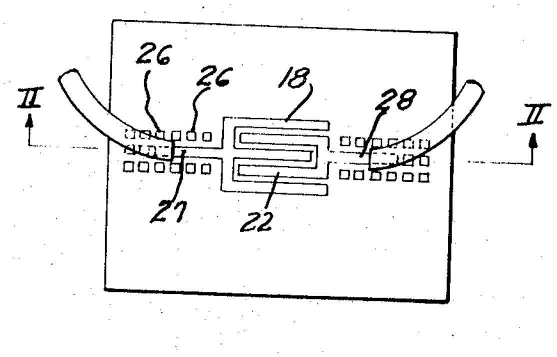
FIGURE 1 is a top view of a semiconductor device according to the present invention showing in particular the orientation of the principal electrodes as well as of the island electrodes and the bonding effect of lead wires secured thereto.

A semiconductor device according to the present invention comprises a substrate layer 10 having a base region 11, a collector region 12, and an emitter region 13. As is well understood in the art, a first PN junction is formed between the collector region 12 and the base region 11, and a second PN junction is formed between the base region 11 and the emitter region 13. Generally, the junction 14 may be referred to as the collector junction, and the junction 15 may be referred to as the emitter junction.

Figure 2:
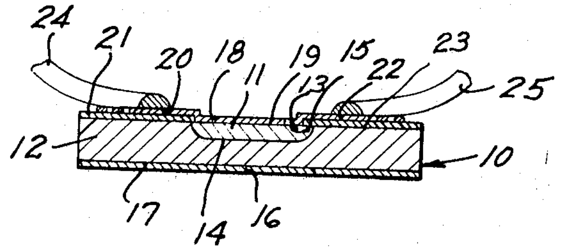
FIGURE 2 is a sectional view of the semiconductor device taken along lines II—II of FIGURE 1.

It will be understood that the transistor illustrated in FIGURES 1 and 2 of the drawing may be either a PNP or an NPN junction triode transistor and that the double junctions indicated, namely the emitter junction and the collector junction, may be either grown or fused crystal types.

As is also well understood in the art, capacitive effects at low frequencies which are only nominal in magnitude can become substantial and even critical as the frequency of operation increases. At higher frequencies in the operation of a semiconductor device such as the transistor shown in FIGURES 1 and 2, input capacitance, output capacitance and feedback capacitance becomes critical at higher frequencies such that the operation of the transistor ceases to be predictable. While the capacitance effect produced in such transistors at higher frequencies increases sharply with increased frequency, that effect can be greatly reduced by reducing the effective area between the electrodes or other portions of the transistor which are responsible for the high frequency low impedance effect. However, reducing the area of various components of a transistor is limited to the point where the mechanical strength requirements of the physical elements involved begins to become exceeded. Accordingly, other means must be provided to reduce the high frequency low impedance effect between the various elements of a transistor. Furthermore, such other means must be compatible with mass production techniques which are so important to the low cost role of a transistor.

As is well understood in the art, a transistor of the type shown in FIGURES 1 and 2 has three electrodes, a base electrode, an emitter electrode, and a collector electrode. Depending upon the way the transistor is connected in an operating circuit, considerable voltage differentials may be caused to appear between the base and emitter electrodes, for instance, or between the base and collector electrodes. As the frequency is increased, the normally small interelectrode capacitance effects and the various conductive layers of the transistor provide relatively low reactance paths and could cause short circuiting. This is particularly true in the case of the planar type transistor as shown in FIGURES 1 and 2.

The planar transistor as shown in FIGURES 1 and 2, has broad plane faces in comparison to the width of the transistor, and electrodes which are disposed parallel to the plane faces tend to develop relatively large capacitance therebetween.

For instance, the substrate layer 10 is provided with a collector electrode 16 which is bonded to the collector region 12 along the entire surface 17 of the substrate layer. If the electrode 16 were separated from the substrate layer by a layer of insulating material, a substantial capacitance could be developed between the electrode and the layer. However, in the case of the electrode 16, the bond of the surface 17 provides an electrical connection between the layer 16 and the substrate layer, and capacitance is not a problem therebetween.

However, the base region 11, is of a much smaller dimension, and any electrode which is secured thereto must be caused to overlie portions of the collector region and therefore must be insulated therefor from by a passivated or insulated layer. Accordingly, a low capacitance resistance can develop at high frequencies between such an electrode and the remainder of the transistor.

Specifically, the base region 11 has an electrode 18 ohmically bonded to the surface 19 thereof. The electrode 18, however, extends to a lead portion 20 which extends over the region 12 of the substrate layer 10. Since the electrode 18 is associated with the base region 11, means must be provided to insulate the lead portion 20 from the layer 12. Such a means takes the form of a passivated layer 21 which may be a silicon oxide coating, a glassy film or the like. It is noted that the dimensions in FIGURES 1 and 2 are greatly exaggerated insofar as the electrodes are concerned. The electrodes 18 and 16, for instance, may be deposited on the various conductive regions of the transistor by vacuum deposition or the like.

Similar to the forming of the electrode 18 associated with the base 11, a further electrode 22 is bonded with ohmic contact to the emitter region 13. The electrodes 18 and 22 may be each provided with finger-like portions arranged in inter-digitated relation as shown in FIGURE 1, with lateral extensions 27 and 28 being provided for connection to external circuitry. The emitter region 13 has even a smaller dimension than the base region 11, and, accordingly, the electrode 22 is caused to extend over and be adjacent to surface portions 23 of the collector region 12. Therefore, high capacitance effects can be developed between the electrode 22 and the surface 23 of the collector region 12.

The principal reason for extending the electrodes 18 and 22 over and adjacent to surface portions of the collector region 12 is to provide an effective bonding area for lead wires 24 and 25. To firmly secure the lead wires 24 and 25 to the associated electrodes as shown in FIGURES 1 and 2, sufficient surface area must be provided to effect a suitable bonding strength. If, however, the surface area of the electrodes 18 and 22 is increased, the effect of the capacitance between the electrodes and the associated layers of a transistor is accordingly increased.

This invention, therefore, provides a means for increasing the bonding area between the lead wires 24 and 25 and the associated electrodes while maintaining the capacitance therebetween at a minimum.

Such a means takes the form of a plurality of island electrodes 26 which are disposed about the extremities 27 and 28 of the electrodes 18 and 22, respectively.

The island electrodes 26 are formed either by vacuum deposition on the passivated layer 21 through a mask, or by selective etching of a vacuum deposited layer. The electrodes are thereby electrically insulated from each other as well as from the electrode portions 27 and 28. The series of island electrodes 26 are disposed to have a width which is substantially greater than the width of the lead wires 24 and 25 and yet are provided to have a minimum capacitance effect on the transistor. The capacitance is reduced due to the fact that the island electrodes not contacting the lead wire do not become part of the transistor circuit and due to the fact that the island electrodes are spaced from one another thereby reducing the effective capacitance while spreading a region of contact over a substantial area of the associated lead wires 24 and 25.

The provision for the island electrodes 26 as shown in FIGURE 1 makes the attaching of the lead wires 24 and 25 particularly adaptable to mass production techniques dut to the fact that the lead wires may be caused to overlie the end portions 27 and 28 of the respective electrodes and simply caused to overlie whichever of the island electrodes happen to be in position beneath the respective wires. Accordingly, while the area of contact between the wires and electrodes is increased by this invention, the effective capacitance is reduced, as the island electrodes which are not contacted by the lead wire do not become part of the electrical circuit of the transistor.

It will be apparent that various modifications and combinations of the features of the present invention may be accomplished by those skilled in the art without departing from the spirit of the invention, and I desire to claim all such modifications and combinations as properly come within the scope of my contribution to the art.

I claim:

1. A semiconductor device comprising:

first and second layers of semiconductor material forming at least one PN junction therebetween, first and second electrodes bonded to said first and second layers, respectively, a substantially nonconductive material deposited on one of said first and second layers and generally surrounding the electrode associated with said one layer, at least one further electrode bonded to said nonconductive material and electrically separated thereby from both said first and second layers, and a lead wire bonded to one of said first and second electrodes and to said further electrode, whereby the bonding strength of said lead wire is increased and the effective capacitance between the electrodes and said semiconductor material is diminished.

2. A semiconductor device in accordance with claim 1 wherein a plurality of further electrodes are provided on said nonconductive layer, each separated from each other and from said first and second layers and wherein said lead wire is bonded across one of said first and second electrodes and across a portion of said further electrodes.

3. A semiconductor device in accordance with claim 2 wherein said plurality of further electrodes are vacuum deposited on said nonconductive layer.

4. A semiconductor device comprising:
a semiconductor substrate having at least one PN junction,
a passivated layer formed on a portion of said substrate,
at least one conductive layer formed on said passivated layer and being electrically connected to said substrate,
a plurality of conductive electrodes formed on said passivated layer,
each of said plurality of electrodes being electrically isolated from said substrate and from each other by said passivated layer, and
an electrical lead wire bonded to said conductive layer and to a number of said electrodes.

5. A semiconductive device in accordance with claim 4 wherein one conductive layer is electrically connected to the positive portion of said substrate and a second conductive layer is electrically connected to the negative portion of said substrate, wherein a plurality of electrodes are formed in the vicinity surrounding each of said conductive layers and first and second lead wires engage said conductive layers respectively and wherein said lead wires overlie and engage a portion of said plurality of electrodes surrounding said conductive layers.

6. A semiconductor device in accordance with claim 5 wherein said conductive layers comprise elongated electrodes and wherein said plurality of electrodes are disposed adjacent the extremities of said elongated electrodes and extend to a width substantially exceeding the width of said elongated electrodes whereby an enlarged effective contact area is provided while minimizing stray capacitance between said electrodes and said substrate.

7. An semiconductor device in accordance with claim 6 wherein said plurality of electrodes are disposed over an area substantially greater than the area of contact between said lead wires and said portion of said plurality of electrodes.

8. A high frequency planar transistor having a semiconductor substrate of one conductivity type
a first diffused portion therein of the opposite conductivity type providing a PN junction therebetween, and
a second diffused portion in said first diffused portion of said one conductivity type,
a passivated layer on a portion of the surface of said transistor,
a conductive electrode on said passivated layer and providing electrical connection to said substrate,
a plurality of discrete spaced electrodes on said passivated layer in proximity to said electrode, and
a lead wire bonded to both said conductive electrode and at least one of said discrete spaced electrodes.

References Cited

UNITED STATES PATENTS

| | | | |
|---|---|---|---|
| 2,680,220 | 6/1954 | Starr et al. | 317—235 |
| 3,356,858 | 12/1967 | Wanlass | 317—234 X |
| 3,379,584 | 4/1968 | Bean et al. | 317—234 X |

JAMES D. KALLAM, *Primary Examiner.*

U.S. Cl. X.R.

29—576; 317—234